(12) United States Patent
Kato

(10) Patent No.: US 7,745,961 B2
(45) Date of Patent: Jun. 29, 2010

(54) ELECTRONIC DEVICE AND METHOD OF ACCESSING INSIDE OF ELECTRONIC DEVICE

(75) Inventor: Kazunori Kato, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 103 days.

(21) Appl. No.: 12/206,573

(22) Filed: Sep. 8, 2008

(65) Prior Publication Data
US 2009/0096295 A1   Apr. 16, 2009

(30) Foreign Application Priority Data
Oct. 12, 2007   (JP)   ............... 2007-266523

(51) Int. Cl.
*H02H 11/00* (2006.01)
(52) U.S. Cl. .................... 307/326; 700/295; 248/176.1; 361/679.41
(58) Field of Classification Search ................ 700/276, 700/56, 295, 22; 174/135; 399/98; 55/385.4; 264/510; 248/311.2, 176.1, 51; 307/326, 307/104, 23, 11, 116, 149, 155; 361/811, 361/679.41, 679.32, 679.4; 320/111, 166
See application file for complete search history.

(56) References Cited

U.S. PATENT DOCUMENTS

| 2008/0236116 | A1* | 10/2008 | Kawasaki | .................. 55/385.4 |
| 2009/0095504 | A1* | 4/2009 | Kato | ......................... 174/135 |
| 2009/0222138 | A1* | 9/2009 | Boudreau et al. | ........... 700/276 |
| 2009/0245850 | A1* | 10/2009 | Kawai et al. | .................. 399/98 |

FOREIGN PATENT DOCUMENTS

JP          03-234691         10/1991

* cited by examiner

*Primary Examiner*—Hung V Duong
(74) *Attorney, Agent, or Firm*—Patterson & Sheridan, LLP

(57) ABSTRACT

An electronic device includes an inner cover for covering a power source and electronic parts such as substrates contained in the inside of the device, an inlet for power cord plug formed to the inner cover for connecting the device to a commercial power supply and a cover to be fitted to the inner cover so as to cover the inner cover, the cover being provided with an inlet protecting section to be engaged with the inlet, the inner cover being made accessible by pulling out the power cord plug.

19 Claims, 4 Drawing Sheets

ELECTRONIC DEVICE AND METHOD OF ACCESSING INSIDE OF ELECTRONIC DEVICE

CROSS-REFERENCE TO RELATED APPLICATIONS

This application is based upon and claims the benefit of priority from the prior Japanese Patent Application No. 2007-266523, filed on 12 Oct. 2007, the entire contents of which are incorporated herein by reference.

BACKGROUND OF THE INVENTION

1. Field of the Invention

The present invention relates to an electronic device having a structure adapted to be relieved of the power source from the viewpoint of protection and safety in storage and a method of accessing the inside of electronic device.

2. Description of the Related Art

Known electronic devices may put an operator who performs maintenance work in danger of electric shock and/or may be damaged by error because the power source thereof can be removably fitted thereto with ease if the power cord remains connected to the power source.

Structures for preventing electric shocks from taking place and the substrates and/or some other component from being damaged by interrupting the power supply when the substrate and/or some other component are to be replaced or substrates and/or some other component are to be added by opening part of the device have been proposed (e.g., refer to Jpn. Pat. Appln. Laid-Open Publication No. 03-234691).

According to the above-cited Patent Document, a bottom cover is rigidly secured in position below a main body cover and the main body cover and a bottom mold are brought into contact with each other when the bottom cover is fitted but a bottom metal plate and a metal plate chassis are separated from each other by a gap of 0.5 mm. Behind the main body, an AC inlet of the power source and a power switch are rigidly secured to a metal plate that is fitted to the metal plate chassis and exposed through notches of the main body cover and the bottom cover. The bottom metal plate is partly turned above the AC inlet by way of the gap between the main body cover and the metal plate so that the bottom cover cannot be removed when the power cord is inserted into the AC inlet.

While the above-described conventional art takes the operation of removing the bottom cover into consideration, moveable parts such as the main body cover and the display can be accessed without pulling out the power cord. In other words, the conventional art is accompanied by a problem that the effect of preventing the device from unsafely relieved of the power source.

SUMMARY OF THE INVENTION

It is therefore an object of the present invention to provide an electronic device having a structure adapted to protect the operator against any electric shock and prevent the device main body from being damaged.

In an aspect of the present invention, there is provided an electronic device including: an inner cover for covering a power source and electronic parts such as substrates contained in the inside of the device; an inlet for power cord plug formed to the inner cover for connecting the device to a commercial power supply; and a cover to be fitted to the inner cover so as to cover the inner cover, the cover being provided with an inlet protecting section to be engaged with the inlet; the inner cover being made accessible by puling out the power cord plug.

DETAILED DESCRIPTION OF THE INVENTION

Throughout this description, the embodiments and examples shown should be considered as exemplars, rather than limitations on the devices and methods of the present invention.

Now, the present invention will be described below by referring to the accompanying drawings that illustrate a preferred embodiment of the invention. Throughout the drawings, the same components are denoted respectively by the same reference symbols and will not be described repeatedly.

This embodiment of electronic device according to the present invention is a POS (point of sales) terminal device. It may be needless to say that the characteristic features of the present invention are applicable to devices other than the POS terminal device.

Figure 1:
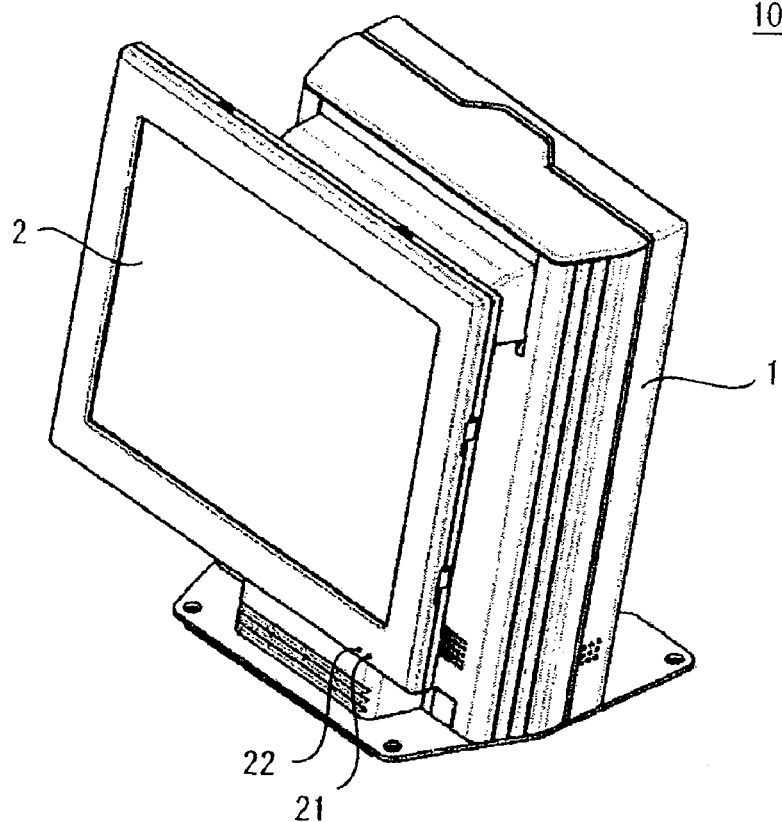
FIG. 1 is a schematic perspective view of a POS terminal device, showing the appearance thereof as viewed from the front side.
Figure 2:
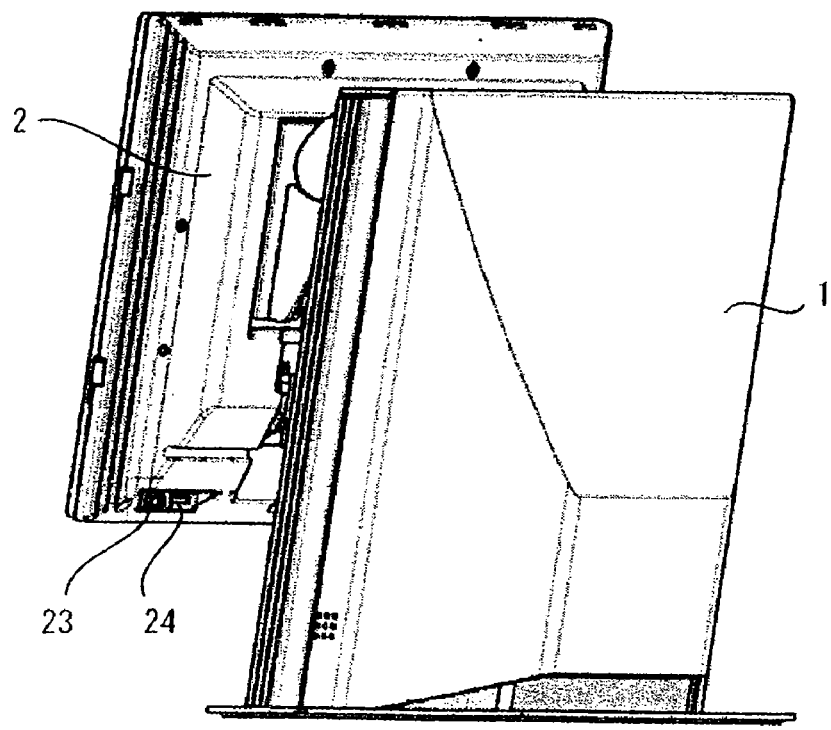
FIG. 2 is a schematic perspective view of the POS terminal device of FIG. 1, showing the appearance thereof as viewed from the rear side.

FIG. 1 is a schematic perspective view of the POS terminal device 100, showing the appearance thereof as viewed from the front side. FIG. 2 is a schematic perspective view of the POS terminal device 100, showing the appearance thereof as viewed from the rear side. As shown in FIG. 1, the POS terminal device 100 roughly includes a POS terminal section 1 and a display 2. The POS terminal device 100 is adapted to be optionally connected to a cash drawer for storing cash and/or checks. The POS terminal section 1 includes a substrate carrying a CPU (central processing unit), memories and so on, an HDD (hard disk drive), a power source and other components (all of which are not shown) that are contained in an inner cover 70 (which will be described in greater detail hereinafter). A predetermined general purpose OS is typically installed in the mother board and the POS terminal device 100 operates according to a predetermined application. The POS terminal section 1 will be described in greater detail hereinafter whenever necessary.

The display 2 is preferably a touch panel type TFT liquid crystal display. The display 2 is adapted to display an image for operating the POS terminal device 100 according to the application stored in the mother board in the POS terminal section 1. An LED 21 for the power source and an LED 22 for the HDD are arranged below the display 2. The LED 21 for the power source indicates the ON/OFF status of the POS terminal device 100. The LED 22 for the HDD is held on so long as the HDD in the POS terminal section 1 is being accessed.

As shown in FIG. 2, a power switch 23 and a luminance adjuster 24 are arranged at a lower part of the rear side of the display 2. The power switch 23 is a switch to which the operator turns on or off the power source of the POS terminal device 100. The luminance adjuster 24 is operated by the operator to adjust the luminance of the display 2 for comfortable viewing.

The display 2 can be operated by the operator to select the position and the angle thereof. For example, it can be tilted upward from a home position as shown in FIGS. 1 and 2 within an angular range between 10 and 60 degrees. When operating the power switch 23 and the luminance adjuster 24, it will be convenient for the operator to tilt the display 2 in order to make the operating area of the device easily visible. Thus, the tilting angle is preferably selectable.

Figure 3:
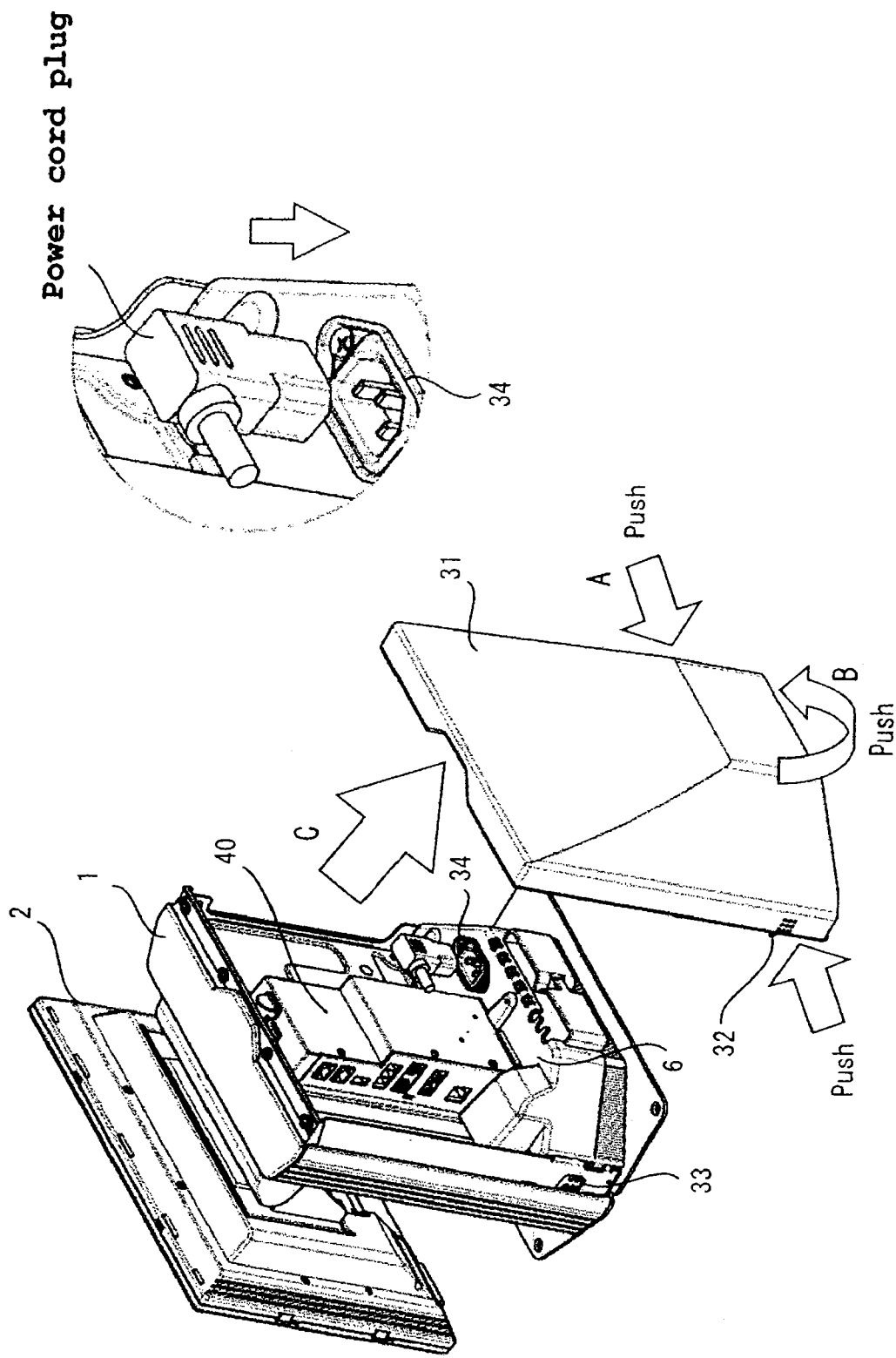
FIG. 3 is a schematic illustration of the connection of a power cord.

FIG. 3 is a schematic illustration of the connection of the power cord plug. As shown in FIG. 3, the rear side of the POS terminal section 1 is covered by a rear surface cover 31. The rear surface cover 31 is a molded resin cover for protecting a cover 6 and a connector section 40, both of which will be described in greater detail hereinafter, against dust and the like.

To connect the power cord plug to the POS terminal device 100, the operator pushes the rear surface cover 31 of the POS terminal section 1 at the two lateral facets (A). Since the rear surface cover 31 is a molded resin cover, it is resiliently deformed as it is pushed so that anchor claws 32 formed on the rear surface cover 31 are released from respective holding sections 33 of the POS terminal section 1. Then, the operator lifts up the rear surface cover 31 at a lower part thereof (B). Subsequently, as the operator pulls the rear surface cover 31 toward him- or herself, the rear surface cover 31 can be removed from the POS terminal section 1.

As shown in FIG. 3, in the POS terminal section 1, the power source, the substrates and other parts are contained and covered by the inner cover 70 and the inner cover 70 is then covered by the cover 6. The inner cover 70 is provided with an AC inlet 34. As the rear surface cover 31 is removed, the operator can access the AC inlet 34. Then, as a predetermined power cord plug is inserted into the AC inlet 34, the POS terminal device 100 can be powered by a commercial power supply.

Figure 4:
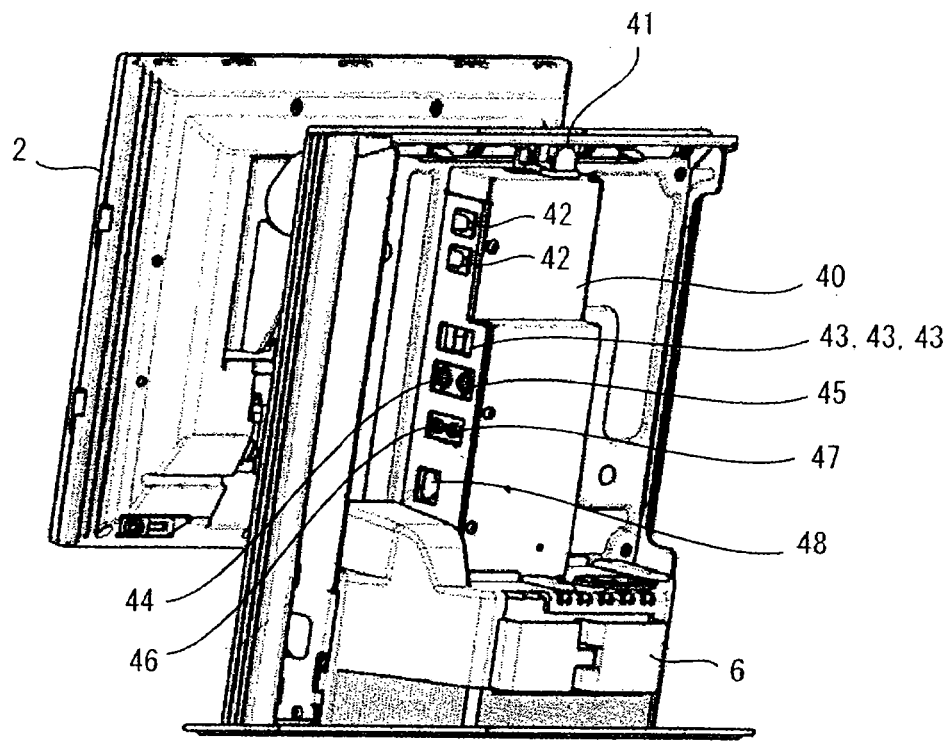
FIG. 4 is a schematic illustration of connectors to be used for connecting the POS terminal device to external appliances.
Figure 5:
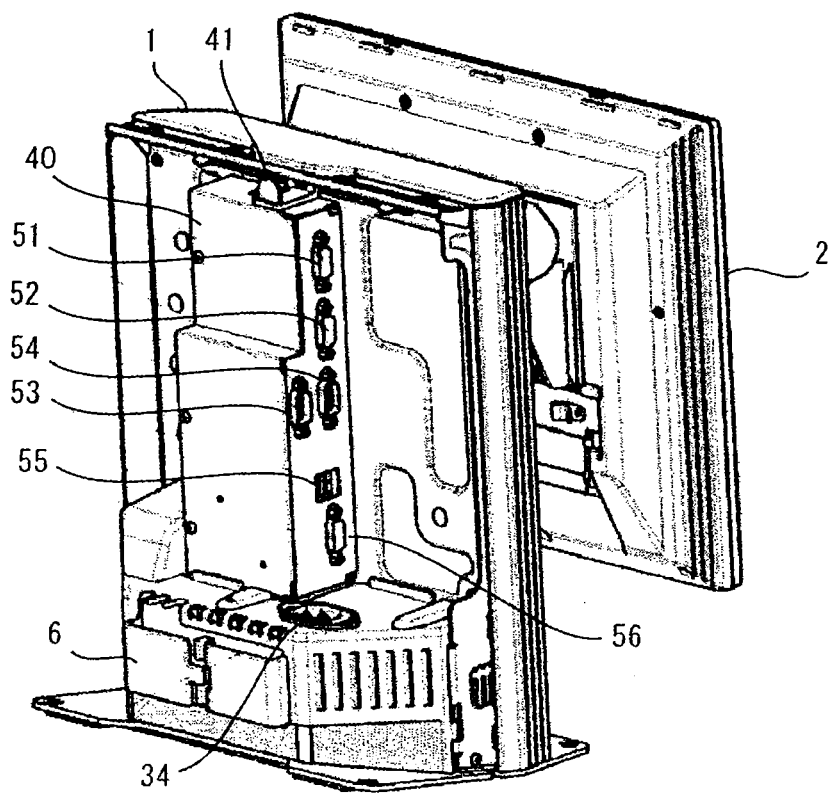
FIG. 5 is a schematic illustration of terminals to be used for connecting the POS terminal device to external appliances.

FIGS. 4 and 5 schematically illustrate terminals to be used for connecting the POS terminal device 100 to one or more than one external appliance.

Referring to FIG. 4, a VFD (fluorescent display) connector 41 is arranged on the top part of a box-shaped connector section 40 that is arranged in the inside of the POS terminal section 1. Two cash drawer terminals 42 are arranged at an upper part of the left side of the connector section 40. Three USB (universal serial bus) ports 43 are arranged below the cash drawer terminals 42. A mouse port 44 and a keyboard port 45 are arranged side by side below the USB ports 43. A microphone terminal 46 and a speaker terminal 47 are arranged side by side below the mouse port 44. An Ethernet (trademark) LAN terminal 48 is arranged below the microphone terminal 46.

Now, referring to FIG. 5, an external VFD connector 51 is arranged at an uppermost part of the right side of the connector section 40 that is arranged in the inside of the POS terminal section 1. A general purpose connector 52 is arranged below the external VFD connector 51. A modem, a bar code scanner, a serial interface type balance or an EFT (electronic fund transfer) terminal for electronically settling accounts can be connected to the general purpose connector 52, which is a male type connector. General purpose connectors 53 and 54 are arranged side by side below the general purpose connector 52. The general purpose connector 53 may typically be same as the general purpose connector 52. The general purpose connector 54 is a female type connector and a modem, a bar code scanner, a serial interface type balance or an EFT (electronic fund transfer) terminal for electronically settling accounts can be connected thereto. A USB port 55 is arranged below the general purpose connector 53. The USB port 55 may typically be a 24V powered USB. A receipt printer may suitably be connected to the powered USB port. An extension VGA (video graphics array) interface female type connector 56 is arranged below the USB port 55.

Figure 6:
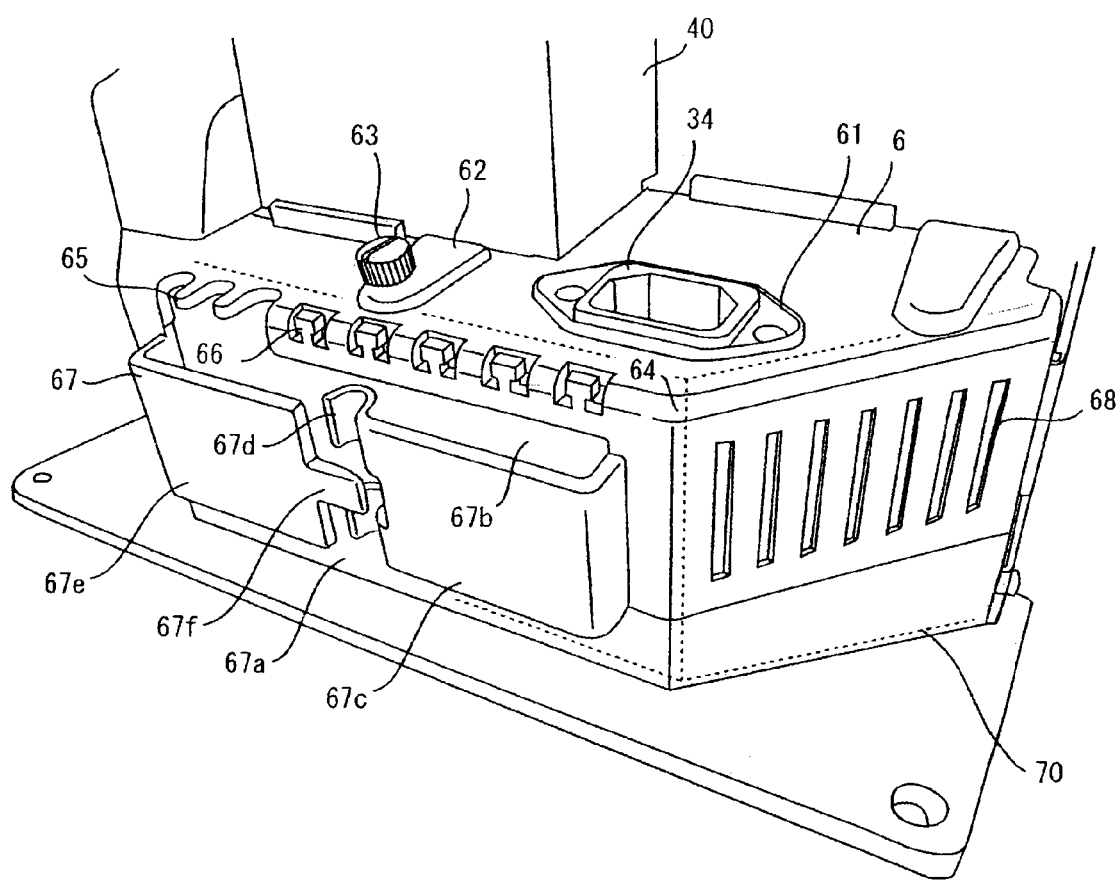
FIG. 6 is a schematic perspective view of a cover.

FIG. 6 is an enlarged schematic perspective view of a lower part of the POS terminal section 1 where the connectors and the ports described above are arranged and become exposed when the rear surface cover 31 is removed from the POS terminal section 1. Referring to FIG. 6, the cover 6 that covers the inner cover 70 indicated by a broken line is shown. The cover 6 is preferably a molded resin cover that is made of ABS resin in order to provide it with insulating and resilient properties. The cover 6 is designed to protect the inner cover 70 under which mainly the power source section, the HDD and the substrates such as the mother board of the POS terminal section 1 are contained. An inlet protecting section 61 is formed on top of the cover 6 so as to surround the AC inlet 34. More specifically, the AC inlet section 34 is adapted to be engaged with the inlet protecting section 61 with a slight gap provided between them. The inlet protecting section 61 is preferably provided with an about 2 mm high edge for suitably protecting and aligning itself with the AC inlet 34.

A fitting section 62 is arranged adjacent to the inlet protecting section 61 in order to fit the cover 6 to the POS terminal section 1. The fittings section 62 is provided with, for example, a knurled clamp screw 63 so as to screw the POS terminal section 1 with the cover 6. Since the clamp screw 63 can be loosened by means of fingers, the cover 6 can be mounted and removed without using any tool. The cover 6 is bent downward from the top surface where the inlet protecting section 61 is formed. The bent section 61 is provided with a plurality of groove sections 65 having a curved profile resembling the outer profile of a cable so that the cables connected to the POS terminal section 1 may be supported in an orderly array. The size of each of the groove sections 65 is preferably determined according to the outer diameter of the sheath of the cable to be received by the groove. More specifically, since the sheaths of a plurality of cables to be connected to the POS terminal section 1 generally show different diameters, the groove sections 65 may preferably be formed in the descending order of the sizes thereof so that the cables may be received by the respective groove sections 65 in a highly neat and orderly manner.

Referring further to FIG. 6, hanger sections 66 for hanging binder bands for neatly binding narrow and twisted signal wires and cables are formed at the right side of the groove sections 65. A clamp section 67 having an opposed substantially L-shaped cross section is formed below the groove sections 65 and the hanger sections 66 and is projected from and formed integrally with one of the surfaces of the cover 6. The clamp section 67 includes a power cord clamping section 67a for clamping the power cord along the outer profile thereof and a holding section 67b for arranging in array and holding cords and signal cables other than the power cord. The power cord clamping section 67a is formed at a front end part of and integrally with one of a pair of substantially L-shaped sections 67c, or substantially L-shaped section 67c, and has a curved contour with a substantially semicircular cross section so as to adapt itself to clamping the power cord along the outer profile thereof. The bent section 67d of the power cord clamping section 67*a* is provided, at a transversal middle part thereof, with a notch so as to divide the bent section 67*d* into two halves. Thus, as a matter of fact, there are two bent sections 67*d*, 67*d* that are juxtaposed with the notch interposed between them. The other substantially L-shaped section 67*e* is provided at the frond end thereof with a tongue section 67*f* at a position located vis-à-vis the notch of the bent section 67*d* at the same level in terms of vertical positional relationship. Therefore, the power cord clamping section 67*a* holds the power cord in the region defined by the bent section 67*d* of one of the substantially L-shaped section 67*c* and the tongue section 67*f* of the other substantially L-shaped section 67*e*. Additionally, cords other than the power cord are held in the region defined by the substantially L-shaped section 67*e* and the groove sections 65. Similarly, signal cables are held in the region defined by the substantially L-shaped section 67*c* and the hanger sections 66.

When the sizes of the above-described groove sections 65 are differentiated, grooves for large diameter cables may be arranged close to the bent section 67*d* and those for small diameter cables may be arranged remote from the bent section 67*d* so that the power cord, cords and signal cables may be arranged in a highly well sorted manner.

Heat radiating slits 68 are arranged in parallel on the other surfaces of the cover 6 as shown in FIG. 6.

As pointed out above, the power cord and cords and cables other than the power cord can be clamped in a highly neat and orderly manner because of the power cord clamping section 67*a* and the holding section 67*b* that are formed in the clamp section 67. Therefore, the connecting areas of the cords including the power cord such as the AC inlet and connectors are relieved of stress.

Now, the operation of accessing the mother board or the like contained in the POS terminal device 100 having the above-described configuration for the purpose of checking, replacing one or more than one components or installing one or more than one additional memories will be described below.

(1) Firstly, the operator takes off the rear surface cover 31 at the rear side of the POS terminal section 1 of the POS terminal device 100. To do this, as pointed out above, the operator pushes the rear surface cover 31 of the POS terminal section 1 at the two lateral facets and releases the anchor claws 32 from the respective holding sections 33 of the POS terminal section 1. Then, the operator lifts a lower part of the rear surface cover 31 and pulls it toward him- or herself. As a result, the rear surface cover 31 can be removed from the POS terminal section 1.

(2) As the rear surface cover 31 is removed, the power cord plug becomes exposed. Then, the operator pulls out the power cord plug from the AC inlet 34.

(3) Thereafter, the operator takes off the power cord from the clamp section 67.

(4) Then, the operator takes off the cords and the cables other than the power cord from the clamp section 67 by way of the gap between the bent section 67*d* and the tongue section 67*f*. At this time, if binder bands are used to bind the cables, an additional operation of twisting the binder bands and removing them from the hanger sections 66 is required.

(5) Subsequently, the operator loosens and pulls out the clamp screw 63 and takes the cover 6 off the inner cover 70.

(6) As the inner cover 70 is removed from the main body of the POS terminal section 1, the operator can access the mother board and other components for the purpose of checking, replacing one or more than one components and/or installing one or more than one additional memories.

After the end of the operation of checking, replacing one or more than one components and/or installing one or more than one additional memories, the operator follows the above listed procedures reversely. Then, as a result, the cords and the cables can be reliably clamped, while relieving the connecting areas of the cords including the power cord such as the AC inlet and connectors from stress.

Thus, with the structure of this embodiment, any of the substrates including the mother board, the HDD, the power source and the other electronic components contained in the inside of the POS terminal section 1 cannot be accessed unless the power cord plug is pulled out so that the danger of electric shock and/or any possible damage of the components can be reliably prevented from taking place.

The present invention is by no means limited to the above-described embodiment, the components of which may be modified and altered in various different ways on the course of embodying the invention. Additionally, any of the plurality of components disclosed in the above embodiment may be appropriately combined to embody the present invention in different ways. For example, some of the components of the embodiment may be omitted and components of different embodiments may be appropriately combined.

What is claimed is:

1. An electronic device comprising:
   an inner cover for covering a power source and electronic parts such as substrates contained in the inside of the device;
   an inlet for power cord plug formed to the inner cover for connecting the device to a commercial power supply; and
   a cover to be fitted to the inner cover so as to cover the inner cover, the cover being provided with an inlet protecting section to be engaged with the inlet;
   the inner cover being made accessible by pulling out the power cord plug.

2. The electronic device according to claim 1, wherein the inlet and the inlet protecting section are engaged with each other with a gap interposed between them.

3. The electronic device according to claim 2, wherein the cover is a molded cover made of ABS resin.

4. The electronic device according to claim 3, wherein the inlet protecting section is formed integrally with the cover.

5. The electronic device according to claim 3, wherein a clamp section for clamping the power cord and cables is formed on the cover.

6. The electronic device according to claim 2, wherein the cover can be removed from and fitted to the inner cover by means of a knurled clamp screw.

7. The electronic device according to claim 6, wherein the inlet protecting section is formed integrally with the cover.

8. The electronic device according to claim 2, wherein the inlet protecting section is formed integrally with the cover.

9. The electronic device according to claim 2, wherein a clamp section for clamping the power cord and cables is formed on the cover.

10. The electronic device according to claim 1, wherein the cover is a molded cover made of ABS resin.

11. The electronic device according to claim 10, wherein the cover can be removed from and fitted to the inner cover by means of a knurled clamp screw.

12. The electronic device according to claim 10, wherein the inlet protecting section is formed integrally with the cover.

13. The electronic device according to claim 10, wherein a clamp section for clamping the power cord and cables is formed on the cover.

14. The electronic device according to claim 1, wherein the cover can be removed from and fitted to the inner cover by means of a knurled clamp screw.

15. The electronic device according to claim 14, wherein the inlet protecting section is formed integrally with the cover.

16. The electronic device according to claim 1, wherein the inlet protecting section is formed integrally with the cover.

17. The electronic device according to claim 1, wherein a clamp section for clamping the power cord and cables is formed on the cover.

18. The electronic device according to claim 1, further comprising:
a rear surface cover for covering the cover and the rear side of the device.

19. The electronic device according to claim 1, wherein the electronic device is a POS terminal device having a POS terminal section and a touch input type display.

* * * * *